United States Patent [19]

Rountree

[11] Patent Number: 5,034,920
[45] Date of Patent: Jul. 23, 1991

[54] CROSS POINT ARRAY MEMORY DEVICE

[75] Inventor: Robert N. Rountree, Richmond, Tex.

[73] Assignee: Texas Instruments Incorporated, Dallas, Tex.

[21] Appl. No.: 518,257

[22] Filed: May 3, 1990

Related U.S. Application Data

[63] Continuation of Ser. No. 436,964, Nov. 15, 1989, abandoned, which is a continuation of Ser. No. 256,670, Oct. 12, 1988, abandoned.

[51] Int. Cl.$^5$ ................................................ G11C 5/06
[52] U.S. Cl. ........................................ 365/72; 365/208
[58] Field of Search ...................... 365/63, 72, 189.01, 365/206–209

[56] References Cited

U.S. PATENT DOCUMENTS 4,581,720  4/1986  Takemae et al. ..................... 365/189
4,701,884 10/1987  Aoki et al. .......................... 365/189

FOREIGN PATENT DOCUMENTS 0108593  5/1988  Japan .................................. 365/205

Primary Examiner—James W. Moffitt
Attorney, Agent, or Firm—Ronald O. Neerings; Thomas W. DeMond; Melvin Sharp

[57] ABSTRACT

A memory array layout using complementary bitlines connected to a single sense amplifier. Extending from the sense amplifier, bitlines which are unconnected are extended to the middle of the array. One complementary bitline is then connected to a series of memory cells extending away from the sense amplifier. The other complementary bitline loops back and is connected to a set of memory cells extending back toward the sense amplifier. The first bitline section extending from the sense amplifier may be advantageously formed in a metal layer above the substrate thereby occupying no space in the substrate itself. All noise generated on the first sections of the bitlines will be canceled by the complementary parallel structure of the bitlines. Because the second sections of the bitlines are laterally separated, a wordline passing across each of the second sections addresses a singel memory cell. Therefore an optimally compact cross-point memory array may be fabricated. Using the described techniques an optimally compact array having an improved signal to noise characteristic may be fabricated.

22 Claims, 5 Drawing Sheets

CROSS POINT ARRAY MEMORY DEVICE

This is a continuation of application Ser. No. 07/436,964, filed 11/15/89, now abandoned, which is a continuation of applicatiion Ser. No. 07/256,670, filed 10/12/88, also abandoned.

FIELD OF THE INVENTION

The present application is related to the field of high density memory design. More specifically, the present invention relates to lay-out schemes and interconnection schemes for memory arrays.

BACKGROUND OF THE INVENTION

Organization of an array of memory cells is one of the keys to the density and electrical characteristic of the memory array. Organizational considerations are particularly acute in the area of dynamic Random Access Memories (dRAMSs). DRAMS are generally comprised of memory cells which includes a storage capacitor and a pass transistor controlling flow of charge into and out of one plate of the storage capacitor. Because of the simple structure of the memory cells, high density of the memory array can be achieved. Memory cells are generally arrayed in an X Y grid with the gates of the pass transistors connected along the X-axis (commonly called the row direction), and the sources of the pass transistors connected to bitlines in the Y direction (commonly called the column direction). In lower density memory arrays, the sense amplifier, which receives the data output from the column lines, received the cell signal on a single lead with the sense amplifier comparing the signal on that lead to a reference potential. As memory arrays grew denser and denser, the size of the capacitor in the memory cells grew smaller. Therefore, the signal provided when the capacitor was accessed also grew smaller. As the signal received grew smaller the ambient noise received on the line began to overwhelm the signal received from the capacitor. Therefore, more sophisticated sense amplification techniques were developed. An example of a memory layout and sense amplification technique can be found in Harland, U.S. Pat. No. 4,045,783, issued Aug. 30, 1977 which is hereby incorporated by reference. The technique shown in Harland provides a balanced input to the sense amplifier. Noise signals caused by electrical fields are generated on both of the complementary bitlines. The sense amplifier compares the signal provided on the memory cell bitline verses the signal provided on the balancing bitline. Thus, noise generated on both bitlines (common mode noise) is canceled. However, because balanced bitlines must run parallel to each other, only one memory cell on one of the parallel bitlines may be addressed. When memory cells were larger, the extra space consumed by the pair of bitlines was used by interleaved memory cells. Thus this space disadvantage was not a problem. Modern dRAM memory cell techniques have advanced to the point to where the surface area consumed by a memory cell is nearly as small as the surface area consumed by the bitline running to the memory cell. An example of such a memory cell is found in U.S. Pat. No. 4,797,373, filed Nov. 12, 1987 and assigned to the assignee of this application which is hereby incorporated by reference. With a cell occupying a minimum surface area, the area where a word line passes through a portion of a balanced pair of bitlines where it can not be connected is a memory cell to simply wasted space.

One solution to this problem is an open bitline technique. In this technique one of a pair of balanced bitlines extends from side of the sense amplifier while the other balanced bitline extends from the other side of the sense amplifier. The bitlines on opposite sides of the sense amplifier are interleaved with bitlines from sense amplifiers on the opposite sides of their respective arrays, thereby allowing addressing a memory cell at each crossing of a word line and bitline. This provides a "cross-point array". However, because the bitlines do not run near each other electrically (i.e. parallel); noise generated on one bitline will not be present on the complementary bitline. Thus the signal to noise ratio of the signal stored on the memory cell verses the noise present on the bitlines is much higher than that with the folded bitline concept.

SUMMARY OF THE INVENTION

The described embodiments of the present invention provide a memory array layout using complementary bitlines connected to a single sense amplifier. Extending from the sense amplifier, bitlines, which are unconnected, are extended to the middle of the array. One complementary bitline is then connected to a set or series of memory cells extending away from the sense amplifier. The other complementary bitline loops back and is connected to a set or series of memory cells extending back towards the sense amplifier. The first unconnected sections or portions extending from the sense amplifier may be advantageously formed in a metal layer above the substrate thereby occupying no space in the substrate itself. All noise generated on the first portions or sections of the bitlines will be canceled by the complementary parallel structure of the bitlines. Because the second portions or sections of the bitlines are laterally separated, a workline passing across each of the second sections addresses a single memory cell. Therefore an optimally compact cross-point memory array may be fabricated. Using the described techniques an optimally compact array having improved signal to noise characteristics may be fabricated.

BRIEF DESCRIPTION OF DRAWINGS

The invention is best understood with regard to the embodiment described in the following Detailed Description of the Preferred Embodiment in conjunction with the drawings wherein.

DETAILED DESCRIPTION OF THE PREFERRED EMBODIMENTS

Figure 1:
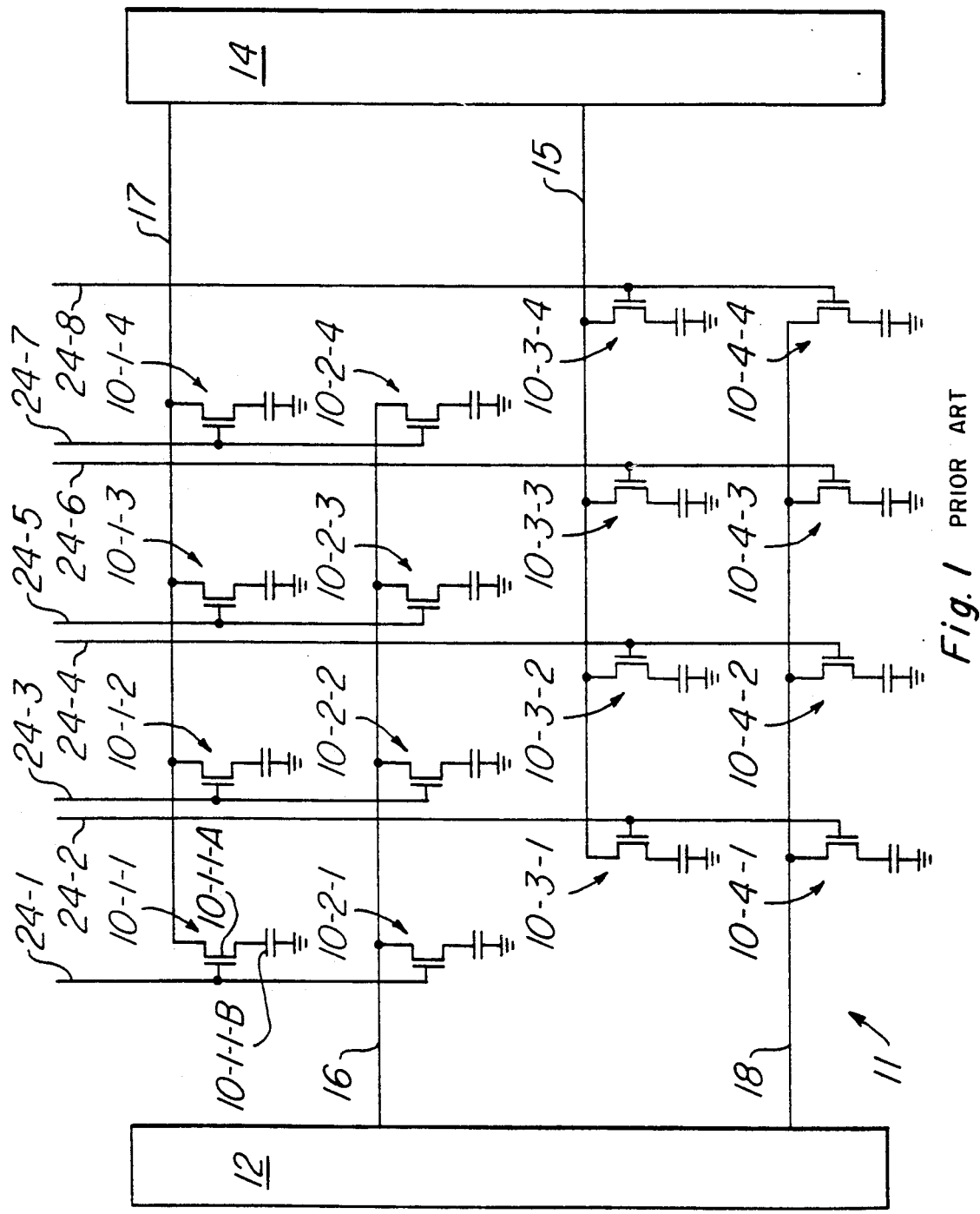
FIG. 1 is a schematic drawing showing a prior art folded bitline layout.
Figure 2:
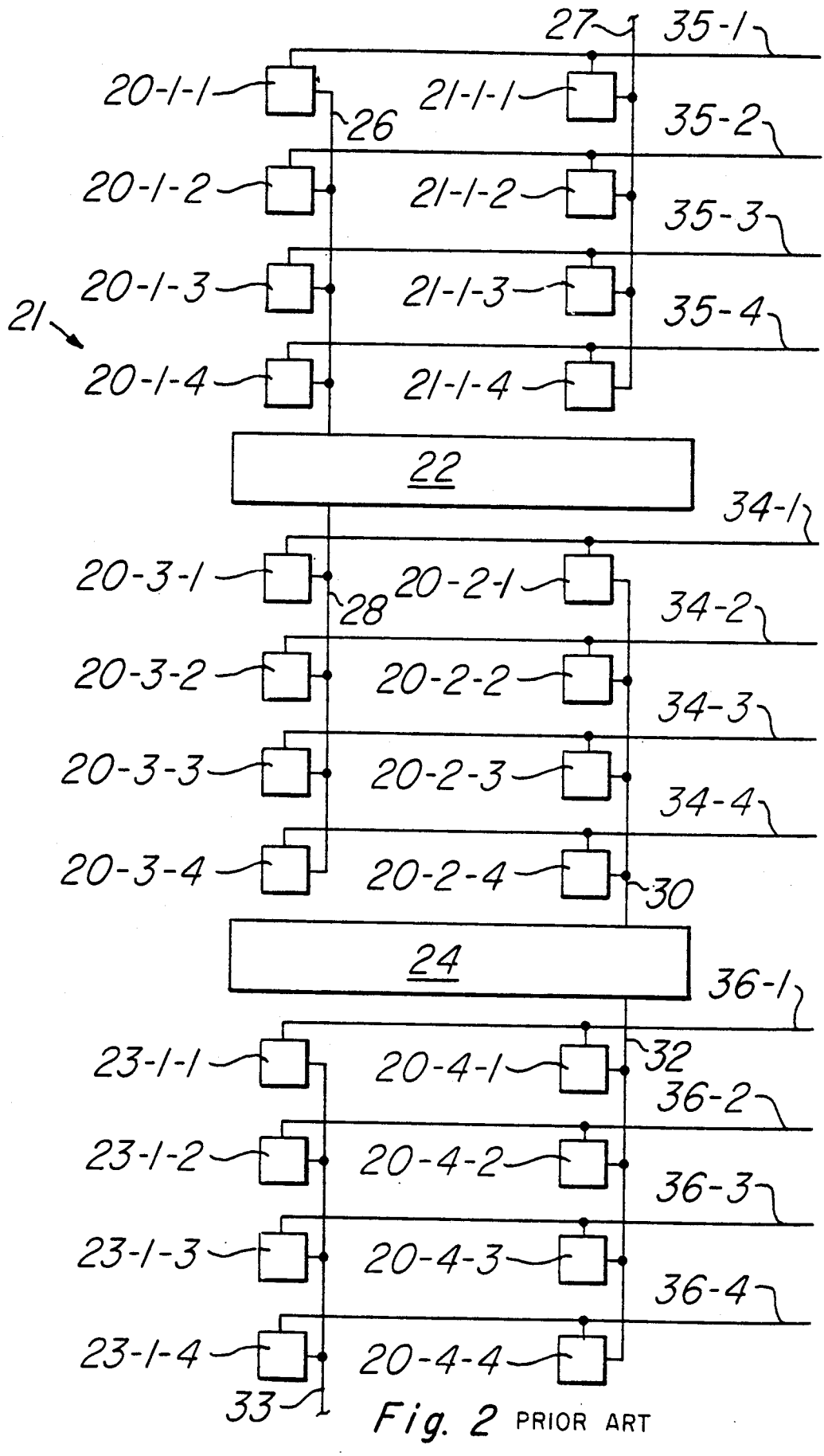
FIG. 2 is a schematic diagram showing a prior art open complementary bitline layout.
Figure 3:
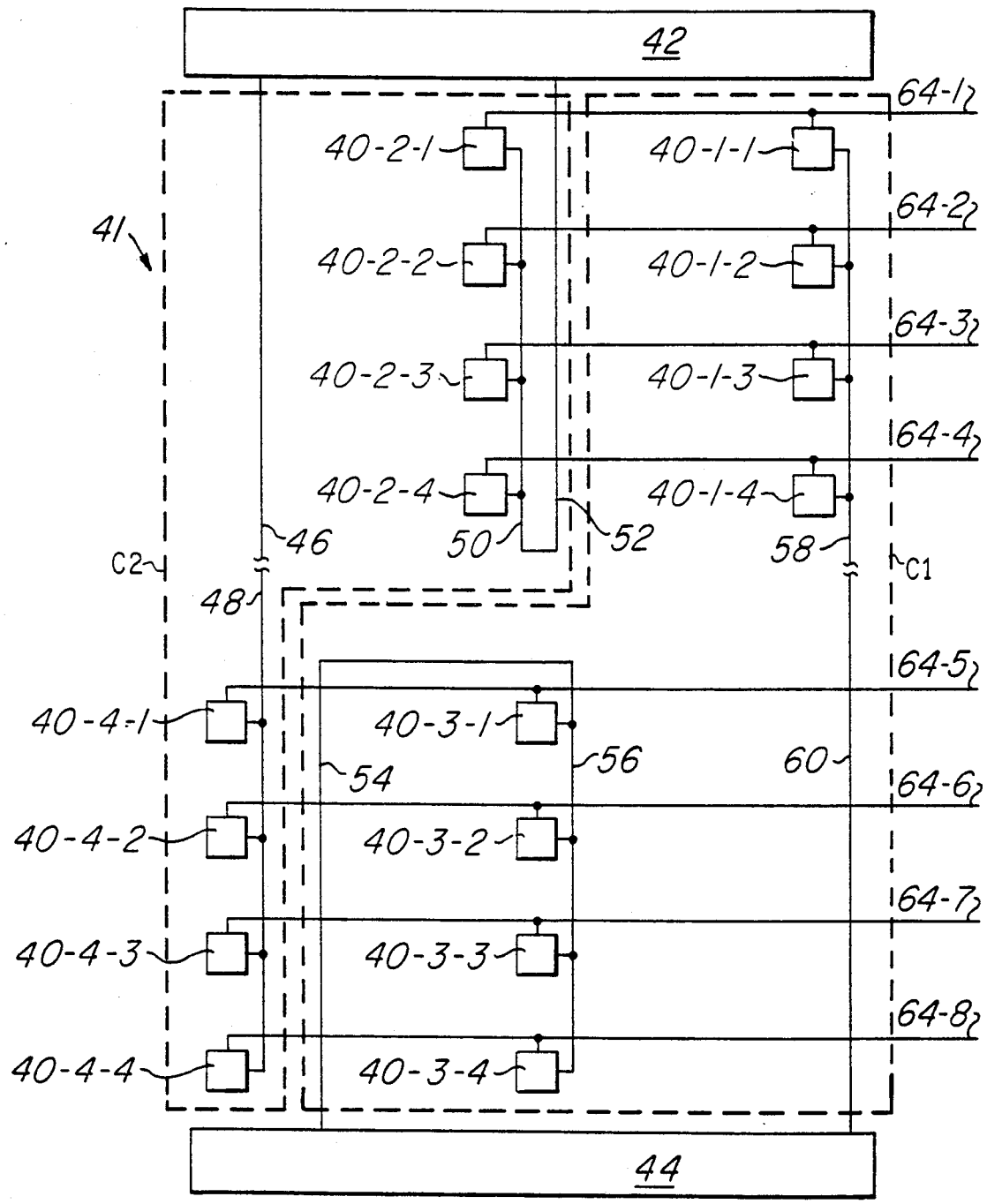
FIG. 3 is a schematic drawing of one embodiment of the present invention.
Figure 4:
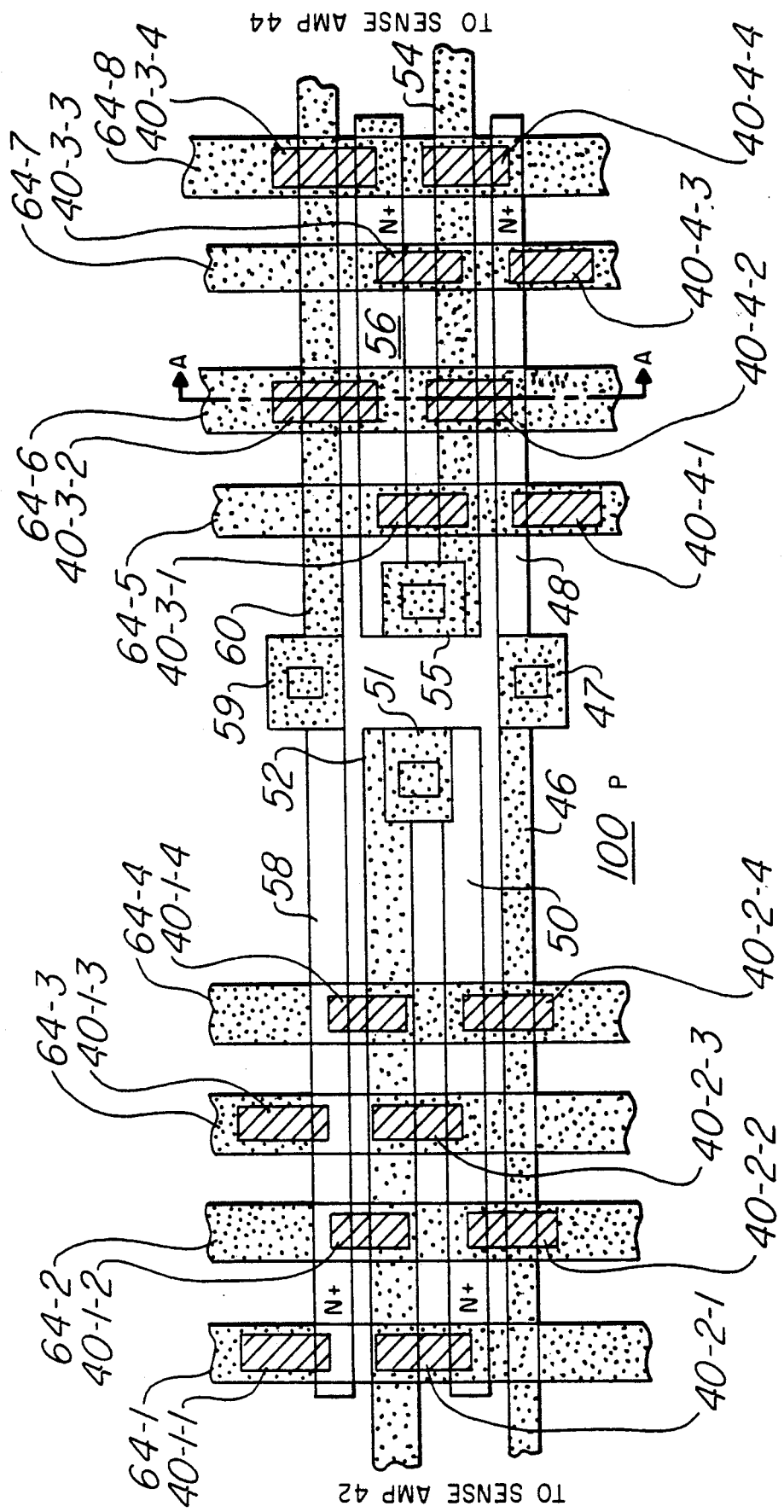
FIG. 4 is a plan view of the bitline portion of the embodiment shown in FIG. 3.
Figure 5:
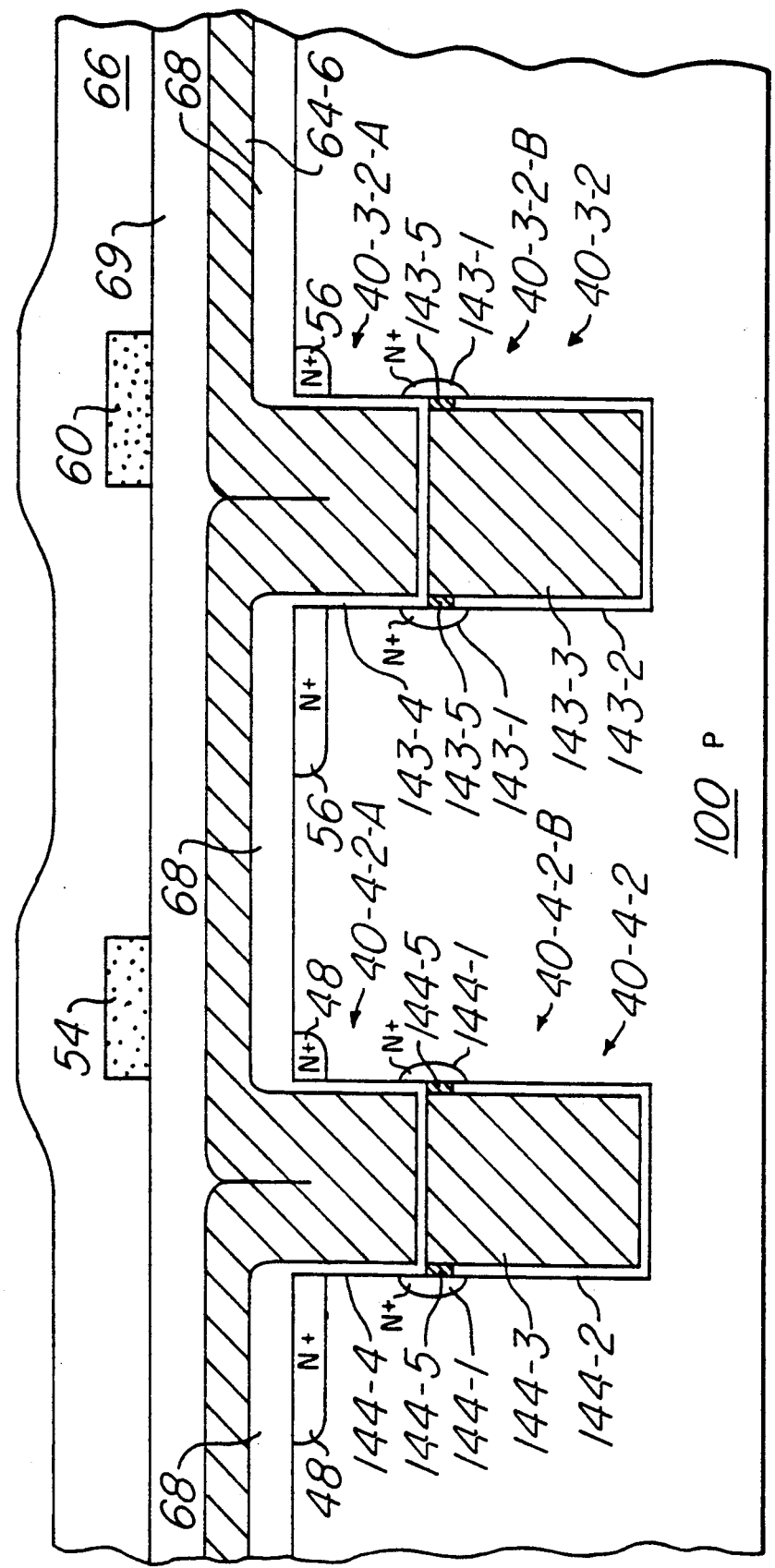
FIG. 5 is a section view of section AA of FIG. 4.

The embodiments described herein of the present invention are best described in comparison with prior art layout arrangements. FIG. 1 is a schematic diagram showing a prior art memory array lay-out having two sense amplifiers with a folded bitline lay-out. FIG. 2 is a schematic diagram showing two sense amplifiers having an open bitline layout. FIG. 3 is a schematic diagram showing one embodiment of the present invention. FIG. 4 further describes the embodiment shown in FIG. 3 by showing the plan view of the bitlines themselves. FIG. 5 is a cross-section view of a portion of FIG. 4 showing the structure of the memory cells and the relative positions of the memory cell interconnections.

Memory array 11 of FIG. 1 illustrates the folded bitline concept which is known in the prior art. The array shown in FIG. 1 is a four-by-four, sixteen cell memory array. Memory cells 10-1-1 through 10-4-4 comprise the array. Each memory cell comprises a transistor and a capacitor. The transistor and capacitor of memory cell 10-1-1 are numbered indicating transistor 10-1-1-A and capacitor 10-1-1-B. Each memory cell of the array comprises a transistor and a capacitor although the numerical designations of the transistor and the capacitor within the memory cell are omitted. The data stored in memory cell 10-1-1 through 10-4-4 are read by sense amplifiers 12 and 14. An example of a sense amplifier design may be found in McAlexander, U.S. Pat. No. 4,239,993, issued Dec. 16, 1980, which is assigned to the assignee of this application and is hereby incorporated by reference. Sense amplifier 12 reads from memory cells connected to bitlines 16 or 18. When sense amplifier 12 reads data provided on bitline 16, bitline 18 is provided to balance the load, voltage level and background noise levels of bitline 16. The difference between the signal provided on bitline 18 and the signal provided on bitline 16 is the signal provided by the addressed memory cell attached to bitline 16, as near as possible. Other techniques such as the inclusion of dummy memory cells (not shown) may be used to provide further balancing of bitlines 16 and 18. Sense amplifier 14 reads data provided on bitlines 15 and 17. Specific memory cells on bitlines 15, 16, 17, and 18 are selected by signals provided on wordlines 24-1 through 24-8. For example, if a logical high (high voltage) signal is provided on wordline 24-5, the data stored on memory cell 10-1-3 is provided to sense amplifier 14 via bitline 17 and the data provided in memory cell 10-2-3 is provided on bitline 16 to sense amplifier 12. Only one data bit at a time may be provided to a sense amplifier, thus separate wordlines are required for the memory cells on bitlines 15 and 18. To address an array having four rows, eight worklines (wordlines 24-1 through 24-8) must be provided. Thus the room required for the routing of eight word lines through the area must be provided. With optimal dense memory cells occupying an area slightly more than the width of a wordline, this arrangement precludes optimal density of the array.

FIG. 2 is a schematic diagram illustrating a prior art memory array 21 using the open bitline architecture. Memory cells 20-1-1 through 20-4-4 correspond to memory cells 10-1-1 through 10-4-4 of array 11 of FIG. 1. Memory cells 21-1-1 through 21-1-4 and memory cells 23-1-1 through 23-1-4 are included to show the interwoven nature of further arrays extending to the left of the page and to the right of the page of FIG. 2. Each of the memory cells 20-1-1 through 20-4-4, 21-1-1 through 21-1-4 and 23-1-1 and 23-1-4 comprise a pass transistor and capacitor connected in a similar manner to those of memory cell 10-1-1 of FIG. 1. These memory cells are shown in FIG. 2 as boxes for simplicity. Sense amplifier 22 addresses memory cells connected to bitlines 26 and 28. Sense amplifier 24 addresses memory cells connected to bitlines 30 and 32. Worklines 34-1 through 34-4 address memory cells 20-2-1 through 20-2-4 and 20-3-1 through 20-3-4. Wordlines 35-1 through 35-4 address memory cells 21-1-1 through 21-4 and 20-1-1 through 20-1-4. Wordlines 36-1 through 36-4 address memory cells 20-4-1 through 20-4-4 and 23-1-1 through 23-1-4. As an example, when a logical one (high voltage signal) is provided on wordline 34-2, the pass transistor (not shown) of memory cells 20-2-2 and 20-3-2 are turned on thus providing the data stored in memory cell 20-2-2 on bitline 30 and the data stored in memory cell 20-3-2 on bitline 28. In this example all of wordlines 35-1 through 35-4 and wordlines 36-1 through 36-4 must have a logical zero (low voltage signal) because only one bit of data may be provided to each of sense amplifiers 22 and 24. Bitline 26 serves as a complementary bitline to bitline 28 for sense amplifier 22 and bitline 32 serves as a complementary bitline to bitline 30 for sense amplifier 24. The array layout of array 21 provided superior packing density to the array layout of FIG. 1 because each wordline is connected to a memory cell at the intersection of each bitline. However, because balanced bitlines are formed on either side of the sense amplifiers, noise signals which occur on one complementary bitline may not occur on the other complementary bitline on the opposite side of the sense amplifier. Thus noise, other than common mode noise, can occur on the bitlines. Thus the signal of the memory cell which is addressed must be large enough to override the noise. In very dense memory cells, this is undesirable because the capacitance of the storage capacitor in the memory cell is limited by the size of the memory cell. Therefore, the size of the signal provided by the memory cell is also limited.

Array 41 of FIG. 3 is a schematic diagram of one embodiment of the present invention. Specific embodiments of the present invention herein described are not to be construed as limiting the scope of the invention. For example, the embodiment of FIG. 3 provides an array of dynamic Random Access Memory cells. Other types of arrays such as static Random Access Memories, programmable logical arrays and the like may benefit from the techniques taught in this specification and are considered within the scope of the invention. Memory array 41 includes memory cells 40-1-1 through 40-4-4 arranged in columns C1 and C2. Memory cells 40-1-1 through 40-1-4 have data terminals connected to sense amplifier 44 by a composite bitline on bitline portions or segments 58 and 60. Memory cells 40-2-1 through 40-2-4 are connected to sense amplifier 42 through a composite bitline or bitline portions or segments 50 and 52. Memory cells 40-3-1 through 40-3-4 are connected to sense amplifier 44 by a composite bitline or bitline portions or segments 54 and 56. Memory cells 40-4-1 through 40-4-4 are connected to sense amplifier 42 by a composite bitline or bitline portions or segments 46 and 48. Wordlines 64-1 through 64-4 address memory cells 40-1-1 through 40-2-4. Wordlines 64-5 through 64-8 address memory cells 40-3-1 through 40-4-4. Of significance, wordlines 64-1 through 64-8, connected to a control terminal of the memory cells, address a memory cell connected to each of the four composite bitlines or first portions (46-48, 50-52, 54-56, and 58-60 of the bitlines). Also of significance partial bitlines or second portions 46, 52, 54 and 60 serve only to connect other partial bitlines or first portions with their respective sense amplifiers. Because these partial bitlines or first portions need not be connected to the data terminals or sources of the pass transistors of memory cells 40-1-1 through 40-4-4, these first portions or partial bitlines may be placed in a level of metal interconnect above the substrate without interfering with the memory cells below. Also of importance is that these bitlines are parallel to the other portions or partial bitlines connected to the same sense amplifier. For example, partial bitlines or first portions 46 and 52 are connected to sense amplifier 42. Therefore, the noise generated in these portions or partial bitlines is common mode and does not affect the sense operation of sense amplifier 42. A similar principal provides a common mode noise cancellation between the first portions or partial bitlines 54 and 60. In summary, array 41 provides common mode cancellation of some noise along with the high density of a cross-point array.

FIG. 4 is a plan view of the array 41 of FIG. 3 excepting sense amplifiers 42 and 44. Sense amplifiers 42 and 44 have been omitted to provide clarity to the drawing. Wordlines 64-1 through 64-8 are formed in a polycrystalline silicon layer on an insulating layer 68 (FIG. 5) above the substrate 100. Partial bitline or first portion 46, partial bitline or first portion 54, partial bitline or first portion 52 and partial bitline or first portion 60 are polycrystalline silicon formed on an insulating layer 69 (FIG. 5) above wordlines 64-1 through 64-8. All of the polycrystalline silicon conductors are formed using standard deposition, doping and lithographic techniques. Partial bitline or second portion 48, partial bitline or second portion 50, partial bitline or second portion 56 and partial bitline or second portion 58 are in N+ diffusions formed in the surface of the substrate by implantation and drive-in techniques known in the art. Partial bitline 46 is connected to partial bitline 48 through via 47. Partial bitline 50 is connected to partial bitline 52 through via 51. Partial bitline 54 is connected to partial bitline 56 through via 55. Partial bitline 58 is connected to partial bitline 60 through via 59. In another embodiment, partial bitlines 46, 52, 54 and 60 may be positioned directly above partial bit lines 50, 58, 48 and 56, respectively. This provides a true cross point array and a very compact layout.

FIG. 5 is a cross-sectional view taken along line AA of FIG. 4. Memory cells 40-4-2 and 40-3-2 are fabricated using the techniques shown in U.S. Pat. No. 4,797,373 which is hereby incorporated by reference and which is assigned to the assignee of the present application. Memory cell 40-3-2 operates as follows. Memory cell 40-3-2 comprises transistor 40-3-2-A and storage capacitor 40-3-2-B. Storage capacitor 40-3-2-B comprises polycrystalline silicon plug 143-3, dilelectric 143-2 and substrate 100. Transistor 40-3-2-A comprises partial bitline/source 56, drain 143-1, gate dielectric 143-4 and a gate provided by polycrystalline silicon wordline 64-6. When a logical one (high voltage) signal is provided on wordline 64-6, a channel region is established between partial bitline 56 and drain 143-1. The data that is either provided on bitline 56 or stored on polycrystalline silicon plug 143-3 is conducted through polycrystalline silicon plug 143-5 and the channel region formed between drain region 143-1 and partial bitline 56. Memory cell 40-4-2 operates in a similar manner and components which are numbered in a parallel fashion correspond to the components described with regard to memory cell 40-3-2. Wordline 64-6 is insulated from substrate 100 by silicon dioxide region 68 which is either deposited or thermally formed on the surface of substrate 100. Partial bitlines 54 and 60 are separated from wordline 64-6 by insulator 69. Insulator 69 may be any number of suitable insulators known in the art, for example, silicon dioxide deposited by chemical vapor deposition. Insulating layer 66 is formed over the surface of partial bitlines 54 and 60 by, for example, chemical vapor deposition of silicon dioxide or other suitable insulator.

Although specific embodiments of the present invention are disclosed herein, they are not to be construed as limiting the scope of the invention. The present invention is limited only by the scope of the claims appended.

What is claimed is:
1. A cross point array memory device, comprising:
a first sense amplifier having first and second input terminals;
a second sense amplifier having first and second input terminals;
a first column of memory cells disposed between said first and second sense amplifiers, said first column including a first subset of memory cells, said first subset being a contiguous group of memory cells nearest said first sense amplifier, said first column also having a second subset, said second subset being those memory cells of said first column not included in said first subset;
a second column of memory cells disposed between said first and second sense amplifiers, said second column including a first subset of memory cells, said first subset being a contiguous group of memory cells nearest said first sense amplifier and said first subset having the same number of memory cells as said first said subset of said first column, said second column also including a second subset consisting of those memory cells of said second column not in said first subset and said second subset having the same number of memory cells as said second subset of said first column;
a plurality of row lines, said row lines comprising conductors connected to a control terminal of no more than one memory cell in each of said first and second columns;
a first partial bitline comprising a conductive line disposed parallel to said first subset of said first column having the end of said first partial bitline nearest said first sense amplifier electrically connected to said first input terminal of said first sense amplifier;
a second partial bitline comprising a conductive line disposed parallel to said second subset of said first column electrically connected to each of said memory cells of said second subset of said first column and having the end of said second partial bitline nearest to said first sense amplifier connected to the end of said first partial bitline disposed away from said first sense amplifier;
a third partial bitline comprising a conductive line disposed parallel to said first subset of said first column having the end of said bitline nearest said first sense amplifier connected to said second input terminal of said first sense amplifier; and
a fourth partial bitline comprising a conductive line disposed parallel to said first subset of said first column electrically connected to each memory cell in said first subset of said first column, the end of said fourth partial bitline nearest said second sense amplifier being electrically connected to the end of said third partial bitline nearest said second sense amplifier.

2. A device as in claim 1 wherein said first and third partial bitlines comprise deposited metal formed on an insulating layer, said insulating layer electrically separating said first and third partial bitlines from said second and fourth partial bitlines.

3. A device as in claim 1 formed over a semiconductive substrate and wherein said second and fourth partial bitlines comprise highly doped regions in said semiconductive substrate.

4. A device as in claim 1 wherein said device is a dynamic random access memory.

5. A device as in claim 1 wherein said first partial bitline is positioned vertically above said second partial bitline and said third partial bitline is positioned vertically above said fourth partial bitline.

6. An integrated circuit device formed on a semiconductor material with first and second conductor levels and including a cross-point array of memory cells formed in the semiconductor material comprising:
first and second sense amplifiers;
a folded bitline including first, second, third and fourth conductive segments, the first and second segments formed on the first conductor level, the third and fourth segments formed on the second conductor level, the first and second segments each including first and second ends, each first end connected to the first sense amplifier, the first and second segments extending toward and second sense amplifier, the third segment having a first end connected to the second end of the first segment, the fourth segment having a first end connected to the second end of the second segment;
a plurality of memory cells formed along said bitline, including a first subset of cells electrically connected to the third segment and a second subset of cells electrically connected to the fourth segment;
a plurality of row lines positioned between the first and second sense amplifiers each electrically connected to a memory cell formed along said bitline, wherein for every crossing of every row line with either the third or fourth segment there is a corresponding one of said plurality of memory cells.

7. The device of claim 6 wherein a first group of said row lines crosses only the third segment and a second group of said row lines crosses only the fourth segment.

8. The device of claim 6 wherein the number of row lines positioned between the first and second sense amplifiers is equal to the number of cells electrically connected to said bitline.

9. The device of claim 6 further including:
a second folded bitline including first, second, third and fourth conductive segments, the first and second segments formed on the first conductor level, the third and fourth segments formed on the second conductor level, the first and second segments each including first and second ends, each first end connected to the second sense amplifier, the first and second segments extending toward the first sense amplifier, the third segment having a first end connected to the second end of the first segment, the fourth segment having a first end connected to the second end of the second segment;
a second plurality of memory cells formed along said second bitline, including a first subset of cells electrically connected to the third segment of said second bitline and a second subset of cells electrically connected to the fourth segment of said second bitline.

10. The device of claim 9 wherein, for all row lines between the first and second sense amplifiers, for every crossing of a row line with either the third or fourth segment of said second bitline there is a corresponding one of said second plurality of memory cells.

11. The device of claim 6 wherein said memory cells each comprise a storage capacitor and a pass transistor.

12. The device of claim 6 wherein said semiconductor material comprises a semiconductor substrate having an upper surface with the second conductor level formed as a heavily doped diffusion region in said surface.

13. The device of claim 6 wherein:
the second conductor level is formed in said semiconductor material and the first conductor level is formed with a layer of polysilicon over said semiconductor material; and
an insulative layer is formed between the second conductive level and the first conductive level.

14. The device of claim 6 wherein:
said memory cells each comprise a storage capacitor and a pass transistor; and
said row lines are formed in a third conductor level, separate and distinct from the first and second conductor levels, comprising polysilicon, said third level including a gate region for each pass transistor.

15. A cross point array memory device, comprising:
A. an array of memory cells arranged in rows and columns, each cell including a control terminal and a data terminal;
B. plural wordlines overlying said array in parallel arrangement, each wordline being generally aligned with one row of memory cells and being connected to the control terminal of every memory cell in that row at each column; and
C. plural pairs of adjacent complementary bitlines overlying said array, each pair being generally aligned with one column of memory cells and being connected to the data terminal of every memory cell in that column, one of said bitlines of each pair of complementary bitlines being connected to one continuous series of memory cells and the other bitline of each pair of complementary bitlines being connected to another continuous series of memory cells.

16. The memory device of claim 15 in which said pairs of bitlines each are of substantially equal length and are connected to substantially equal numbers of memory cells.

17. The memory device of claim 15 in which said pairs of complementary bitlines each have a first portion and a second portion, said first portions extending substantially along one another and being free of connections to said memory cells, and said second portions extending substantially away from one another and respectively being connected to said one and another continuous groups of memory cells.

18. The memory device of claim 17 including a semiconductor substrate carrying plural layers of material, said first portions are formed in an upper layer and said second portions are formed in a lower layer and are connected by vias.

19. The memory device of claim 18 in which said first portions are formed in a metal layer above said substrate.

20. The memory device of claim 17 in which said second portion of one bitline of said pair extends substantially in the same direction from said first portion of said one bitline, and said second portion of the other bitline of said pair loops back along said first portion of said other bitline.

21. The memory device of claim 15 including plural sense amplifiers, each pair of bitlines being connected to and extending from one of said sense amplifiers, and said bitlines from each sense amplifier being interleaved with said bitlines from other sense amplifier.

22. The memory device of claim 21 in which said bitlines interleave on alternating columns.

* * * * *